United States Patent
Ogihara et al.

[19]

[11] Patent Number: 6,133,588
[45] Date of Patent: Oct. 17, 2000

[54] LIGHT-EMITTING ELEMENT ARRAY AND FABRICATION METHOD WITH SEPARATE LIGHT-EMITTING AND CURRENT-CONDUCTING DIFFUSION AREAS

[75] Inventors: Mitsuhiko Ogihara; Masumi Taninaka; Takatoku Shimizu; Hiroshi Hamano, all of Tokyo, Japan

[73] Assignee: Oki Electric Industry Co., Ltd., Tokyo, Japan

[21] Appl. No.: 09/128,856

[22] Filed: Aug. 4, 1998

[30] Foreign Application Priority Data

Sep. 22, 1997 [JP] Japan .................................... 9-256692

[51] Int. Cl.⁷ .................................................. H01L 33/00
[52] U.S. Cl. .................................. 257/88; 257/91; 257/99
[58] Field of Search ............................... 257/94, 96, 101, 257/102, 91, 99, 88, 79

[56] References Cited

U.S. PATENT DOCUMENTS 5,189,496  2/1993  Kuwabara ................................. 257/91
5,523,590  6/1996  Ogihara et al. ........................... 257/91

OTHER PUBLICATIONS

Yoshihiro Takekida, "Design of Optical Printers", Triceps, 1985, pp. 121–126.

*Primary Examiner*—Minh Loan Tran
*Attorney, Agent, or Firm*—Venable; Robert J. Frank; Keith G. Haddaway

[57] ABSTRACT

A light-emitting element is formed in a semiconductor substrate having a semi-insulating upper layer and a conductive lower layer. An impurity is diffused into both layers, forming a light-emitting area by creating a pn junction in the lower layer. An additional current-conducting area is formed by diffusion of the impurity into the upper layer. An electrode is formed on the substrate, making electrical contact with the current-conducting area, but not covering any part of the light-emitting area. The current-conducting area carries current from the electrode to the light-emitting area.

11 Claims, 4 Drawing Sheets

LIGHT-EMITTING ELEMENT ARRAY AND FABRICATION METHOD WITH SEPARATE LIGHT-EMITTING AND CURRENT-CONDUCTING DIFFUSION AREAS

BACKGROUND OF THE INVENTION

The present invention relates to a light-emitting element such as a light-emitting diode, to an array of such light-emitting elements, and to a method of fabricating such an element or array.

Light-emitting diodes or LEDs are widely used as display devices, because they emit bright light and can be driven at a low voltage by simple circuitry. For similar reasons, LED arrays are used as light sources in electrophotographic printers. A conventional LED array is fabricated by selectively diffusing a p-type impurity such as zinc into an n-type gallium—arsenide substrate to form an array of pn junctions. Each pn junction functions as a LED. Current is fed to the LEDs through an array of aluminum electrodes formed on the emitting surface of the array. The current returns through a common gold-germanium electrode formed on the opposite surface of the array.

In conventional LED arrays, the light-emitting diffusion area of each LED is partly covered by the aluminum electrode, but this arrangement can create certain problems. If too much of the diffusion area is covered, then too much of the emitted light is blocked by the aluminum electrode. If the covered area is too small, however, then the contact resistance between the diffusion region and electrode becomes too high. In either case, the light-emitting efficiency of the LED is reduced.

The problem of reduced light-emitting efficiency becomes particularly serious when the diffusion region has a small sheet resistance, because then most of the light emission takes place directly below the aluminum electrode. The problem also becomes serious in high-density arrays. In an array with a linear density of one thousand two hundred dots per inch (1200 DPI), for example, the small contact area between the LEDs and their electrodes is subject to relatively large fabrication variations, which can create large differences in light-emitting characteristics among the LEDs in the array. In the extreme case, the contact area can become too small for a LED to be driven.

SUMMARY OF THE INVENTION

It is accordingly an object of the present invention to provide a light-emitting element having a high light-emitting efficiency, not limited by electrode contact area.

Another object of the invention is to provide an array of such light-emitting elements.

Yet another object is to provide an array of light-emitting elements with highly uniform light-emitting characteristics.

Still another object is to provide a fabrication method for the above light-emitting element and array.

The invented light-emitting element comprises a semiconductor substrate having a semi-insulating upper layer, and having a lower layer of a first conductive type. A light-emitting area of a second conductive type is formed by diffusion of an impurity into the semi-insulating upper layer and the lower layer, creating a pn junction in the lower layer. A current-conducting area of the second conductive type is formed by diffusion of the impurity into the semi-insulating upper layer. The current-conducting area is contiguous with the light-emitting area, but does not extend into the lower layer. An electrode is formed on the semiconductor substrate, making electrical contact with the current-conducting area, which carries current from the electrode to the light-emitting area.

The invented array of light-emitting elements comprises a plurality of the above light-emitting elements, formed in a single semiconductor substrate.

The invented method of fabricating a light-emitting element creates a light-emitting element of the type described above, or an array of these light-emitting elements, by the steps of:

(a) forming a semiconductor substrate having a semi-insulating upper layer and a lower layer of the first conductive type;

(b) diffusing an impurity of a second conductive type into these layers, thereby forming the light-emitting area;

(c) diffusing the impurity into the semi-insulating upper layer, thereby forming the current-conducting area; and (d) forming an electrode on the semiconductor substrate, the electrode making electrical contact with the current-conducting area but not covering any part of the light-emitting area.

Steps (b) and (c) are preferably carried out simultaneously, by solid-phase diffusion.

DETAILED DESCRIPTION OF THE INVENTION

Embodiments of the invention will be described with reference to the attached illustrative drawings.

Figure 1:
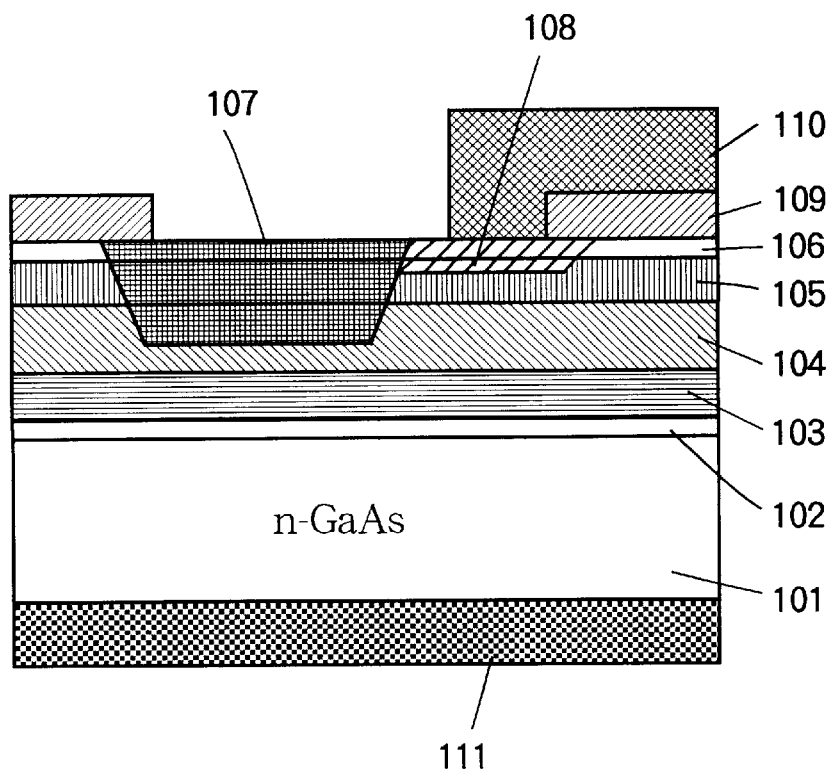
FIG. 1 shows a sectional view of a LED embodying the present invention.

In the embodiment shown in FIG. 1, a LED is formed in a material comprising semiconducting and semi-insulating layers of gallium arsenide (GaAs) and aluminum—gallium—arsenide (AlGaAs). From bottom to top, the layers are an n-type GaAs substrate 101, an n-type GaAs buffer layer 102, an n-type $Al_zGa_{1-z}As$ layer 103, an n-type $Al_yGa_{1-y}As$ lower layer 104, a semi-insulating $Al_xGa_{1-x}As$ layer 105, and a semi-insulating GaAs layer 106 layers 105 and 106 forming sub-layers of an upper layer. The four layers 103 to 106 are formed by epitaxial growth. The parameters x, y, and z have values strictly between zero and one, and y has a smaller value than x and z. The band-gap energy of the n-type $Al_zGa_{1-z}As$ layer 103 and semi-insulating $Al_xGa_{1-x}As$ layer 105 is consequently greater than the band-gap energy of the n-type $Al_yGa_{1-y}As$ layer 104.

The difference in band-gap energies should be large enough to be effective in confining injected carriers. A difference of approximately three-tenths of an electron volt (0.3 eV) or greater is preferred. A band-gap energy difference of 0.3 eV is obtained if, for example, x and z are equal to 0.4, and y is equal to 0.15.

Zinc (Zn) is selectively diffused into this substrate to form a light-emitting diffusion area 107 and a current-conducting diffusion area 108. The diffusion depth $X_{j1}$ of the light-emitting diffusion area 107 is greater than the diffusion depth $X_{j2}$ of the current-conducting diffusion area 108. The light-emitting diffusion area 107 extends from the surface into the n-type $Al_yGa_{1-y}As$ layer 104, where a pn junction is formed at the diffusion front. The pn junction is the light-emitting part of diffusion area 107. The diffusion front of the current-conducting diffusion area 108 is located in the semi-insulating $Al_xGa_{1-x}As$ layer 105, and does not form a pn junction. The only function of the current-conducting diffusion area 108 is to provide a current path to the light-emitting diffusion area 107.

The diffusion mask used in the formation of the diffusion areas 107 and 108 is left in place as an inter-layer insulating film 109. The inter-layer insulating film 109 comprises an insulating material such as silicon nitride (SiN), aluminum oxide ($Al_2O_3$), or aluminum nitride (AlN). A p-electrode 110 is formed on the inter-layer insulating film 109, making ohmic contact with the current-conducting diffusion area 108. The p-electrode 110 does not make contact with the light-emitting diffusion area 107. The p-electrode 110 comprises, for example, aluminum or an alloy thereof.

An n-electrode 111 is formed on the underside of the substrate, in contact with the n-type GaAs substrate 101. The n-electrode 111 comprises, for example, a gold alloy.

Figure 2:
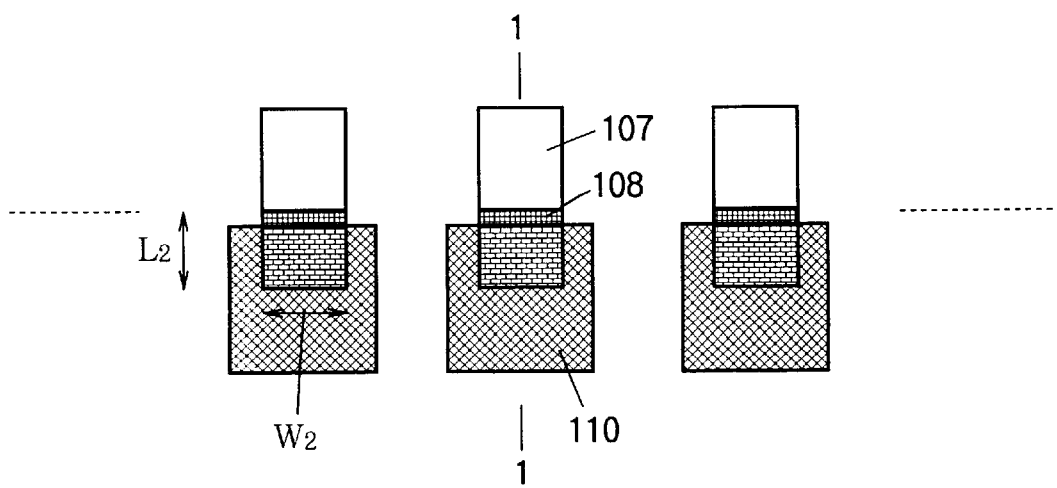
FIG. 2 shows a plan view of an array of LEDs of the type shown in FIG. 1.

FIG. 2 is a plan view of part of a GaAs chip having a linear array of LEDs of the type shown in FIG. 1. FIG. 1 shows a sectional view through line 1—1 in FIG. 2. The current-conducting diffusion area 108 in each LED has, for example, a width $W_2$ of ten micrometers (10 $\mu$m), and a length $L_2$ of ten micrometers (10 $\mu$m), providing a contact area of nearly one hundred square micrometers.

The diffusion conditions can be controlled to provide a diffusion depth $x_{j1}$ of 1.5 $\mu$m for the light-emitting diffusion area 107, and a diffusion depth $X_{j2}$ of 1.0 $\mu$m for the current-conducting diffusion area 108, with a carrier density of $1 \times 10^{20}/cm^3$ in both areas. The resistivity of the current-conducting diffusion area 108 is then two milliohm-centimeters (2 m$\Omega$cm). With the above width and length dimensions, the resistance of the current-conducting diffusion area 108 is twenty ohms (20$\Omega$).

When the LED array is driven, external circuitry feeds current through the p-electrodes 110 to selected LEDs. In each driven LED, current flows through the current-conducting diffusion area 108 to the light-emitting diffusion area 107, then through the pn-junction and the underlying n-type layers to the n-electrode 111. Light is emitted by electron-hole recombination in the vicinity of the pn junction.

In the invented LED, a certain voltage drop occurs due to current flow through the electrical resistance of the current-conducting diffusion area 108, but this voltage drop is not large. If the driving current is, for example, three milliamperes (3 mA) per LED, then with the values given above, even if all of the current had to negotiate the entire length of the current-conducting diffusion area 108, the voltage drop in the current-conducting diffusion area 108 would be only sixty millivolts (60 mV). This is only about three percent (3%) of the voltage drop due to the junction resistance of the LED. The actual voltage drop in the current-conducting diffusion area 108 is somewhat less than this, because much of the current traverses somewhat less than the full length of the current-conducting diffusion area 108.

The additional resistance of the current-conducting diffusion area 108 is accordingly a minor and substantially negligible factor in the driving of the LEDs. A more important factor is that the p-electrode 110 does not cover any of the light-emitting diffusion area 107, and so does not block any of the emitted light. Another important factor is that the contact area between the p-electrode 110 and the current-conducting diffusion area 108 can be enlarged as much as necessary without encroaching on the light-emitting area. The invented LED thus permits high light-emitting efficiency, not limited by contact-area requirements.

A LED array employing these LEDs can provide both high light-emitting efficiency in each LED, and a high degree of uniformity in the light-emitting characteristics of different LEDs. High uniformity is obtained because the p-electrodes 110 cover substantially the entire current-conducting diffusion area 108 in each LED, so the size of the contact area is not greatly affected by fabrication variations. Furthermore, since the p-electrodes 110 do not cover the light-emitting diffusion areas 107, variability in the dimensions of the p-electrodes 110 does not create variations in the size of the light-emitting diffusion areas 107 in the array.

Figure 3:
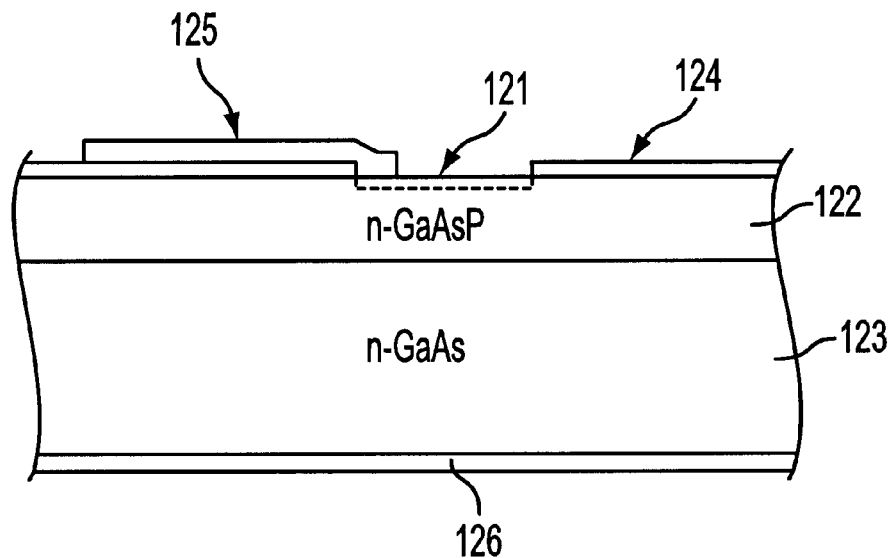
FIG. 3 shows a sectional view of a conventional LED.

For comparison, FIG. 3 shows a conventional LED having a single p-type zinc diffusion area 121 formed in an n-type gallium—arsenide—phosphide (GaAsP) epitaxial layer grown on an n-type gallium—arsenide substrate 123. The insulating layer 124, p-electrode 125, and n-electrode 126 are similar to the corresponding elements in FIG. 1, but the p-electrode 125 covers part of the p-type zinc diffusion area 121, which is the light-emitting area. In a LED array using this conventional LED structure, fabrication variations can cause greater variations in the contact area, with comparatively large effects on the light-emitting efficiency.

Next, a fabrication process for the LED in FIG. 1 or array in FIG. 2 will be described.

Figure 4:
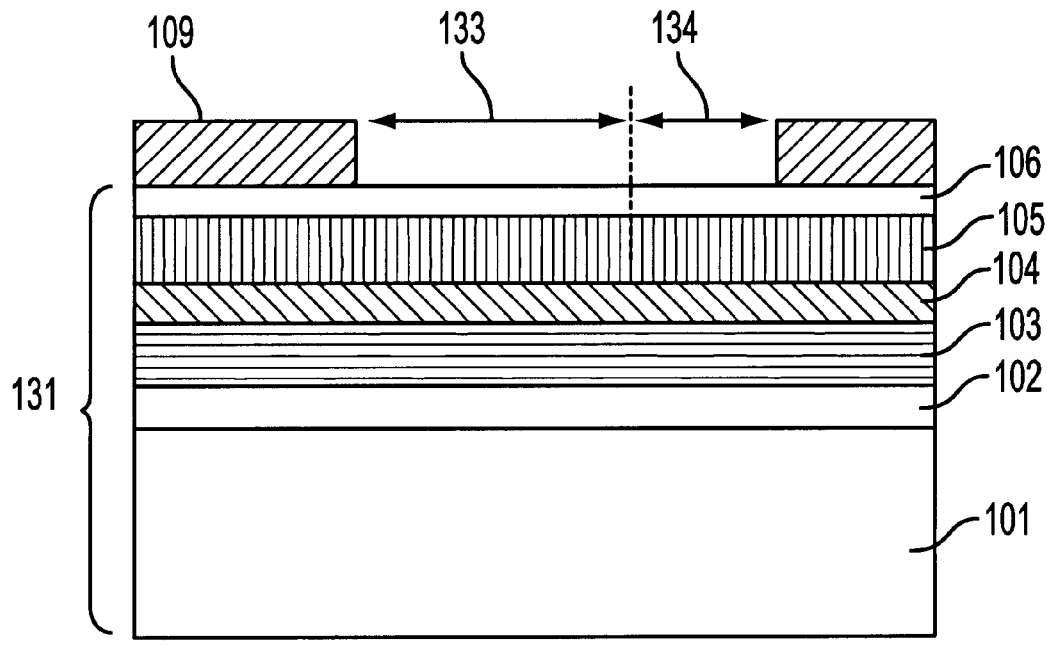
FIG. 4 shows a first step in the invented fabrication method.

Referring to FIG. 4, the process starts from a semiconductor wafer 131 having the layer structure described above, comprising an n-type GaAs substrate 101, an n-type GaAs buffer layer 102, an n-type $Al_zGa_{1-z}As$ layer 103, an n-type $Al_yGa_{1-y}As$ layer 104, a semi-insulating $Al_xGa_{1-x}As$ layer 105, and a semi-insulating GaAs layer 106. A diffusion mask 109 is formed on the surface of the wafer 131. For each LED to be formed, the diffusion mask 109 has a window comprising a first part 133 and a second part 134.

Figure 5:
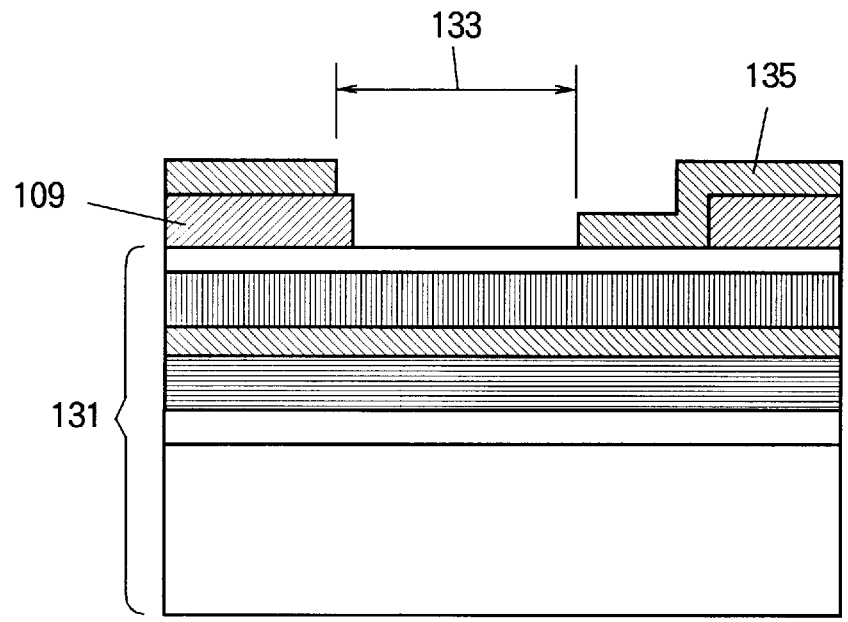
FIG. 5 shows a second step in the invented fabrication method.

Referring to FIG. 5, a diffusion control film 135 is deposited and patterned to leave the first part 133 of each diffusion window uncovered, while covering the second part.

Figure 6:
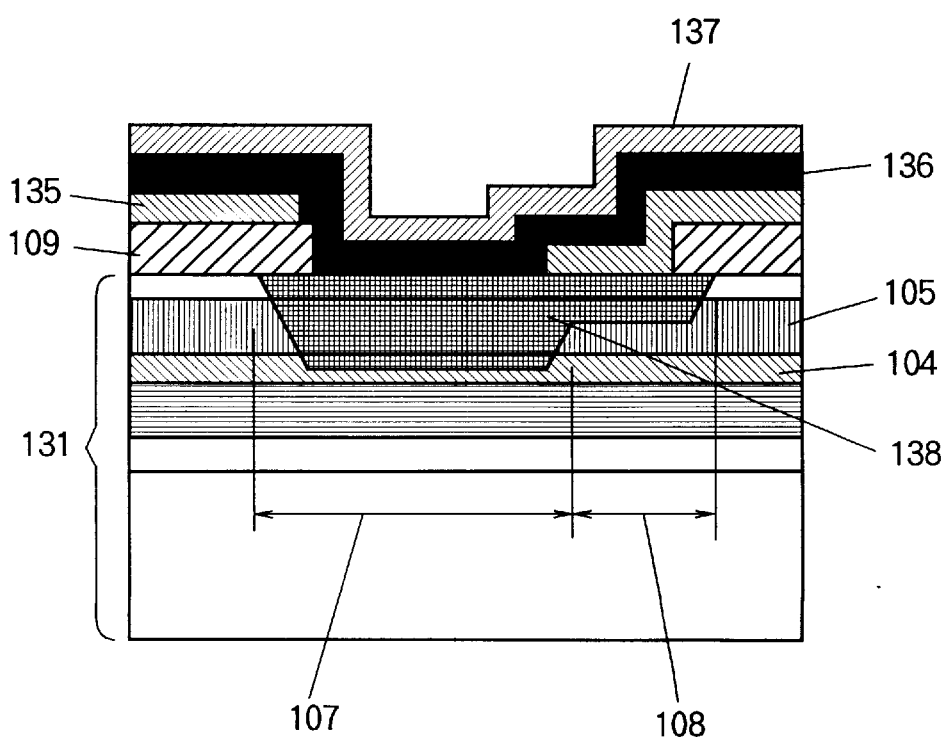
FIG. 6 shows a third step in the invented fabrication method.

Referring to FIG. 6, a diffusion source film 136 and an anneal cap film 137 are deposited. The diffusion source film 136 comprises a material containing zinc. The wafer is now annealed at a temperature of, for example, 650° C. for a duration of, for example, two hours. A single p-type diffusion area 138 is thereby formed in each LED, but the diffusion depth is greater in the area in which zinc can diffuse directly from the diffusion source film 136 into the wafer substrate 131 than in the area in which the zinc must diffuse through the diffusion control film 135. A comparatively deep light-emitting diffusion area 107 and a comparatively shallow current-conducting diffusion area 108 are thereby formed. The annealing conditions are selected so that the diffusion front of the light-emitting diffusion area 107 is disposed in the n-type $Al_yGa_{1-y}As$ layer 104, and the diffusion front of the current-conducting diffusion area 108 is disposed in the semi-insulating $Al_xGa_{1-x}As$ layer 105.

Although not shown in the drawing, an additional protective film of, for example, aluminum nitride may be deposited on the lower side of the wafer 131 to protect the wafer 131 during the annealing process.

Figure 7:
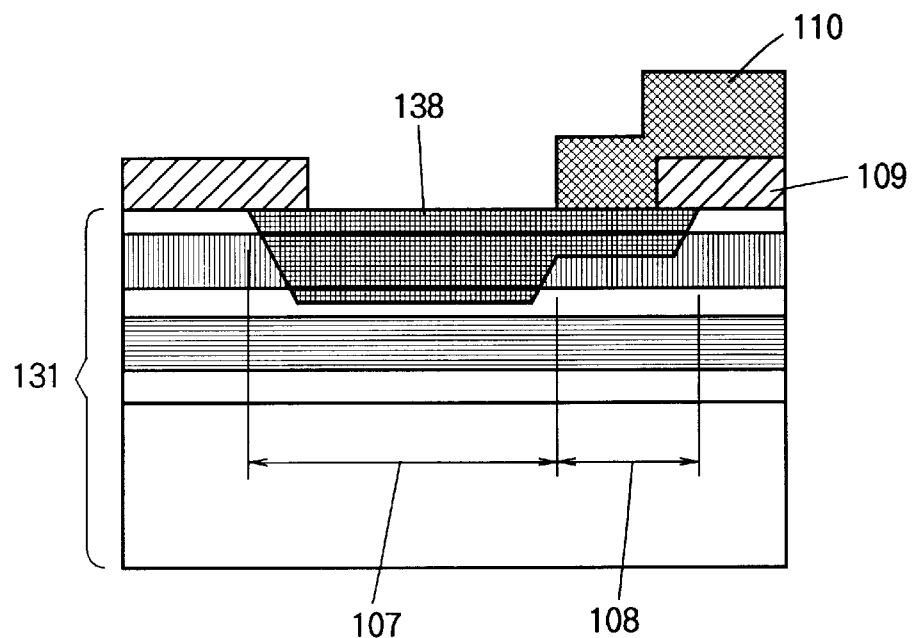
FIG. 7 shows a fourth step in the invented fabrication method.

Referring to FIG. 7, the anneal cap film 137, diffusion source film 136, and diffusion control film 135 are removed by etching. The diffusion mask 109 is not etched, but is left as an insulating layer. An aluminum film is deposited by, for example, electron-beam vacuum evaporation, and is patterned by standard photolithography to form the p-electrode 110, making contact with the current-conducting diffusion area 108 but not covering any part of the light-emitting diffusion area 107. After photolithography, the wafer is sintered to form a good ohmic contact between the p-electrode 110 and current-conducting diffusion area 108.

Figure 8:
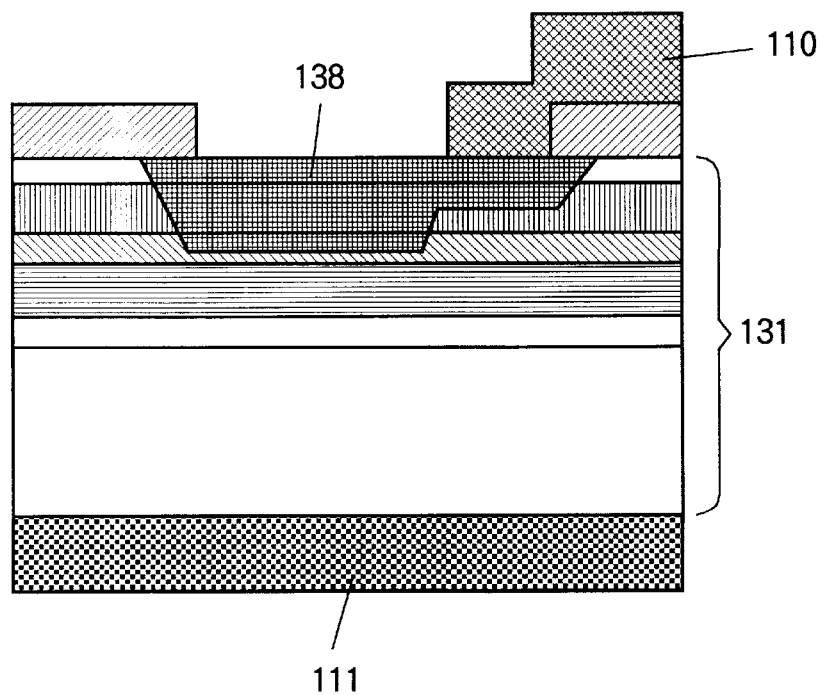
FIG. 8 shows a fifth step in the invented fabrication method.

Referring to FIG. 8, the underside of the wafer 131 is polished to a mirror finish, then the n-electrode 111 is deposited. If the underside of the wafer 131 already had a mirror finish at the beginning of the fabrication process, and a protective film was applied to the underside of the wafer 131, as mentioned above, to protect the underside during the solid-phase diffusion process, then this protective film is removed before the n-electrode 111 is deposited, and the n-electrode 111 is deposited without further polishing. The n-electrode 111 comprises, for example, a compound of gold and germanium mixed with nickel and gold (AuGe/Ni/Au), which can be deposited by electron-beam evaporation. The n-electrode 111 can also be sintered to form a good ohmic contact.

Various materials can be used for the diffusion mask 109, the diffusion control film 135, the diffusion source film 136, and the anneal cap 137, but it is advantageous if the etchant that removes the diffusion control film 135 does not etch the diffusion mask 109. As one example, aluminum nitride can be employed for the diffusion mask 109 and anneal cap 137, a mixture of zinc oxide (zNO) and silicon dioxide ($SiO_2$) for the diffusion source film 136, and silicon nitride for the diffusion control film 135. As a variation of this example, silicon nitride can be employed for the diffusion mask 109, and aluminum nitride for the diffusion control film 135. Other combinations of materials are also possible.

This fabrication method enables two p-type diffusion areas with different diffusion depths to be formed by a single diffusion process. A further advantage is that solid-phase diffusion enables a high zinc concentration to be achieved easily, resulting in a low sheet resistance in the diffusion areas.

The invention is not limited to the materials mentioned in the preceding embodiments. For example, the n-type GaAs substrate 101 may comprise semi-insulating GaAs, if electrical contact is provided between the n-electrode 111 and n-type GaAs buffer layer 102 in an n-contact area on the upper side of the wafer 131 (the side on which the p-electrodes 110 are formed). The n-contact area can be formed by etching the semi-insulating semiconductor layers 106 and 105 and the n-type semiconductor layers 104 and 103 from the upper surface to expose the n-type GaAs buffer layer 102. The n-electrode 111 is then deposited on the exposed surface of the GaAs buffer layer 102 in the n-contact area.

The GaAs buffer layer 102 and $Al_zGa_{1-z}As$ layer 103 may also be semi-insulating, if electrical contact is provided between the n-electrode 111 and n-type $Al_yGa_{1-y}As$ layer 104. In this case, the semi-insulating semiconductor layers 106 and 105 are removed by etching from the upper side of the wafer 131 to expose the n-type $Al_yGa_{1-y}As$ layer 104 in an n-contact area, in which the n-electrode 111 is then deposited.

Other semiconductor materials such as silicon may be employed, instead of gallium arsenide.

Those skilled in the art will recognize that further variations are possible within the scope claimed below.

What is claimed is:

1. A light emitting element, comprising:
    a semi-insulating upper layer and a lower layer of a first conductive type;
    a light-emitting area of a second conductive type, formed by diffusion of an impurity into said semi-insulating upper layer and said lower layer, possessing a pn junction in said lower layer;
    a current-conducting area of said second conductive type, formed by diffusion of said impurity into said semi-insulating upper layer, contiguous with said light-emitting area but not extending into said lower layer; and
    an electrode formed on a semiconductor substrate; making electrical contact with said current-conducting area, for feeding current through said current-conducting area to said light-emitting area,
    wherein said semiconductor substrate has an additional layer of said first conductive type disposed below said lower layer, and said lower layer has a lower band-gap energy than said additional layer.

2. The light-emitting element of claim 1, wherein said electrode does not cover any part of said light-emitting area.

3. The light-emitting element of claim 1, wherein said lower layer comprises an aluminum—gallium—arsenide compound.

4. The light-emitting element of claim 1, wherein said semi-insulating upper layer comprises gallium arsenide.

5. The light-emitting element of claim 1, wherein said semi-insulating upper layer comprises aluminum gallium arsenide.

6. The light-emitting element of claim 1, wherein said semi-insulating upper layer comprises a gallium—arsenide sub-layer and an aluminum—gallium—arsenide sub-layer.

7. The light-emitting element of claim 1, wherein said impurity comprises zinc.

8. The light-emitting element of claim 1, wherein said lower layer has a lower band-gap energy than said semi-insulating upper layer.

9. The light-emitting element of claim 1, wherein said light-emitting area and said current-conducting area are formed by a single diffusion of said impurity.

10. An array of light-emitting elements as described in claim 1, formed in a single semiconductor substrate.

11. A light emitting element comprising:
    a semi-insulating upper layer and a lower layer of a first conductive type, said upper and lower layers being contiguous, without another layer being interposed therebetween;
    a light-emitting area of a second conductive type, formed by diffusion of an impurity into said semi-insulating upper layer and said lower layer, possessing a pn junction in said lower layer;
    a current-conducting area of said second conductive type, formed by diffusion of said impurity into said semi-insulating upper layer, contiguous with said light-emitting area but not extending into said lower layer; and
    an electrode formed on said semiconductor substrate; making electrical contact with said current-conducting area, for feeding current through said current-conducting area to said light-emitting area, whereby substantially all of the current fed from said electrode into said current-conducting area flows across the pn junction in said light-emitting area.

* * * * *